United States Patent
Huisinga et al.

(10) Patent No.: US 9,305,878 B2
(45) Date of Patent: Apr. 5, 2016

(54) INTEGRATED CIRCUITS AND METHODS FOR FABRICATING INTEGRATED CIRCUITS WITH CAPPING LAYERS BETWEEN METAL CONTACTS AND INTERCONNECTS

(71) Applicant: GLOBALFOUNDRIES, Inc., Grand Cayman (KY)

(72) Inventors: Torsten Huisinga, Dresden (DE); Carsten Peters, Dresden (DE); Andreas Ott, Dresden (DE); Axel Preusse, Radebeul (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/570,617

(22) Filed: Dec. 15, 2014

(65) Prior Publication Data

US 2015/0097291 A1 Apr. 9, 2015

Related U.S. Application Data

(62) Division of application No. 13/778,558, filed on Feb. 27, 2013, now Pat. No. 8,932,911.

(51) Int. Cl.
*H01L 23/522* (2006.01)
*H01L 23/485* (2006.01)
*H01L 23/532* (2006.01)
(Continued)

(52) U.S. Cl.
CPC ...... *H01L 23/5226* (2013.01); *H01L 21/76814* (2013.01); *H01L 21/76849* (2013.01); *H01L 23/485* (2013.01); *H01L 23/528* (2013.01);
(Continued)

(58) Field of Classification Search
CPC ............ H01L 23/481; H01L 21/76885; H01L 23/49827; H01L 2224/82; H01L 21/76802; H01L 23/5226; H01L 21/76804; H01L 21/76843; H01L 2924/16152; H05K 1/115; H05K 2201/09481
See application file for complete search history.

(56) References Cited

U.S. PATENT DOCUMENTS 5,643,807 A * 7/1997 Frijlink ............... H01L 29/1029
257/E21.407
6,004,876 A * 12/1999 Kwon ............... H01L 21/76805
257/E21.584
(Continued)

FOREIGN PATENT DOCUMENTS

KR 1020040001741 A 1/2004
KR 1020080077551 A 8/2008
(Continued)

OTHER PUBLICATIONS

The Intellectual Property Office, Examination Report for Taiwanese Patent Application No. 102133335 dated Jul. 28, 2015.
(Continued)

*Primary Examiner* — Evan Pert
*Assistant Examiner* — Gustavo Ramallo
(74) *Attorney, Agent, or Firm* — Ingrassia Fisher & Lorenz, P.C.

(57) ABSTRACT

Integrated circuits and methods for fabricating integrated circuits are provided. In an exemplary embodiment, an integrated circuit includes a metal contact structure, an electrically conductive capping layer formed on the metal contact structure, and a conductive via electrically connected to the metal contact structure through the electrically conductive capping layer.

19 Claims, 3 Drawing Sheets

(51) Int. Cl.
*H01L 21/768* (2006.01)
*H01L 23/528* (2006.01)

(52) U.S. Cl.
CPC .... *H01L 23/53238* (2013.01); *H01L 23/53295* (2013.01); *H01L 2924/0002* (2013.01)

(56) References Cited

U.S. PATENT DOCUMENTS

| | | | |
|---|---|---|---|
| 6,013,547 A * | 1/2000 | Liaw | H01L 21/76895 257/E21.507 |
| 6,143,641 A | 11/2000 | Kitch | |
| 6,232,223 B1 | 5/2001 | Tran et al. | |
| 6,248,666 B1 * | 6/2001 | Frijlink | H01L 21/28587 257/E21.407 |
| 6,297,110 B1 * | 10/2001 | Chan | H01L 21/76802 257/E21.577 |
| 6,455,409 B1 | 9/2002 | Subramanian et al. | |
| 6,495,709 B1 * | 12/2002 | Celinska | C03C 17/25 423/625 |
| 6,566,250 B1 | 5/2003 | Tu et al. | |
| 6,573,606 B2 | 6/2003 | Sambucetti et al. | |
| 6,617,248 B1 * | 9/2003 | Yang | C23C 16/40 257/E21.018 |
| 6,974,770 B2 | 12/2005 | Costrini et al. | |
| 7,410,894 B2 | 8/2008 | Chinthakindi et al. | |
| 7,521,358 B2 * | 4/2009 | Bright | H01L 21/76805 257/E21.495 |
| 7,763,542 B2 | 7/2010 | Kim et al. | |
| 7,989,338 B2 | 8/2011 | Zhang et al. | |
| 8,026,539 B2 * | 9/2011 | Hargrove | H01L 21/28079 257/288 |
| 8,129,267 B2 | 3/2012 | Cabral, Jr. et al. | |
| 8,193,086 B2 * | 6/2012 | Letz | H01L 21/76814 438/630 |
| 2002/0142552 A1 * | 10/2002 | Wu | H01L 21/823418 438/301 |
| 2002/0146899 A1 * | 10/2002 | Chun | H01L 21/76831 438/618 |
| 2006/0226448 A1 * | 10/2006 | Park | H01L 27/10855 257/204 |
| 2008/0081432 A1 * | 4/2008 | Kim | H01L 21/823437 438/424 |
| 2009/0243109 A1 * | 10/2009 | Nopper | H01L 21/76814 257/758 |
| 2010/0207176 A1 * | 8/2010 | Hargrove | H01L 21/28079 257/288 |
| 2010/0289125 A1 * | 11/2010 | Feustel | H01L 21/76849 257/632 |
| 2010/0308380 A1 * | 12/2010 | Rothwell | H01L 21/76807 257/288 |

FOREIGN PATENT DOCUMENTS

| | | |
|---|---|---|
| KR | 1020090098905 A | 9/2009 |
| WO | 2007117880 A1 | 10/2007 |
| WO | 2011018857 A1 | 2/2011 |

OTHER PUBLICATIONS

Korean Intellectual Property Office, Notice of Office Action for Korean Patent Application No. 10-2013-0128434 mailed Jun. 1, 2015.

* cited by examiner

INTEGRATED CIRCUITS AND METHODS FOR FABRICATING INTEGRATED CIRCUITS WITH CAPPING LAYERS BETWEEN METAL CONTACTS AND INTERCONNECTS

CROSS-REFERENCE TO RELATED APPLICATIONS

This is a divisional of U.S. application Ser. No. 13/778,558, filed Feb. 27, 2013.

TECHNICAL FIELD

The technical field generally relates to integrated circuits and methods for fabricating integrated circuits, and more particularly relates to integrated circuits and methods for fabricating integrated circuits that include capping layers between metal contact structures and metal interconnects.

BACKGROUND

Photoresist masks are commonly used in the semiconductor industry to pattern materials such as semiconductors or dielectrics. In one well-known application, photoresist masks are used in a dual damascene process to form metal interconnects during the back end of line (BEOL) metallization of a semiconductor device. The dual damascene process involves formation of a photoresist mask on a dielectric layer overlying a metal contact structure or metal conductor layer, such as a copper layer. The dielectric layer is then etched according to the photoresist mask to form a via and/or trench that expose the underlying metal contact structure or metal conductor layer. The via and trench, collectively known as dual damascene structure, are typically defined using two lithography steps. After the lithography steps are performed, the photoresist mask is removed from the dielectric layer before a conductive material is deposited into the via and/or trench to form an interconnect.

As scaling of semiconductor devices continues, it becomes more difficult to achieve the necessary critical dimensions for vias and trenches. Thus, metal hard masks are increasingly used to provide better profile control of vias and trenches. The metal hard masks are typically made of titanium (Ti) or titanium nitride (TiN). A wet etching process is normally performed after forming the via and/or trench of the dual damascene structure to remove the metal hard mask. In the conventional process, it is desirable that the wet etching process use an etchant chemistry that effectively removes the metal hard mask without affecting the underlying metal conductor layer and dielectric material. In other words, the etchant chemistry is required to etch the metal hard mask at a much faster rate than it etches the metal conductor layer and dielectric layer.

However, titanium nitride is commonly used as both a metal hard mask and as a barrier metal in metal contact structures. Therefore, it may be difficult or impossible to use a wet etchant to selectively remove titanium nitride hard masks after performing a dual damascene process that exposes a metal contact structure including a titanium nitride barrier metal. Specifically, the etchant will attack and form voids in the metal contact structure during removal of the metal hard mask. Alternatively, the same metals cannot be used for the metal hard mask and in the metal contact structure.

Accordingly, it is desirable to provide improved integrated circuits and improved methods for fabricating integrated circuits that facilitate removal of metal hard masks while avoiding attack of the underlying metal contact structure. In addition, it is desirable to provide integrated circuits and methods for fabricating integrated circuits that form capping layers between metal contact structures and metal interconnect structures. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits are provided. In one exemplary embodiment, a method for fabricating integrated circuits includes forming a metal contact structure that is electrically connected to a device. A capping layer is selectively formed on the metal contact structure, and an interlayer dielectric material is deposited over the capping layer. A metal hard mask is deposited and patterned over the interlayer dielectric material to define an exposed region of the interlayer dielectric material. The method etches the exposed region of the interlayer dielectric material to expose at least a portion of the capping layer. The method includes removing the metal hard mask with an etchant while the capping layer physically separates the metal contact structure from the etchant. A metal is deposited to form a conductive via electrically connected to the metal contact structure through the capping layer.

In accordance with another embodiment, a method is provided for fabricating an integrated circuit. The method forms a metal structure over a semiconductor substrate and selectively deposits a capping layer on the metal structure. A metal pattern is formed over the capping layer. The method includes forming an aperture to the capping layer using the metal pattern as a mask. The method removes the metal pattern with an etchant and fills the aperture to form a conductive via electrically connected to the metal structure.

In another embodiment, an integrated circuit is provided. The integrated circuit includes a metal contact structure electrically connected to an electrical device. An electrically conductive capping layer is formed on the metal contact structure. The integrated circuit further includes a conductive via electrically connected to the metal contact structure through the electrically conductive capping layer.

BRIEF DESCRIPTION OF THE DRAWINGS

Embodiments of integrated circuits and methods for fabricating integrated circuits having capping layers between metal contacts and interconnects will be described in conjunction with the following drawing figures, wherein like numerals denote like elements, and wherein.

DETAILED DESCRIPTION

The following detailed description is merely exemplary in nature and is not intended to limit the integrated circuits or the methods for fabricating integrated circuits claimed herein. Furthermore, there is no intention to be bound by any expressed or implied theory presented in the preceding technical field, background or brief summary, or in the following detailed description.

Integrated circuits and methods for fabricating integrated circuits having metal contact structures and metal interconnects as described herein avoid issues faced by conventional processes for forming metal interconnects. For example, the methods described herein provide for forming a conductive capping layer over metal contact structures. After covering the capping layer with a dielectric material, dual damascene or other lithography steps using a metal hard mask may be performed to expose at least a portion of the capping layer. Then, the metal hard mask may be removed with a suitable etchant. Because the capping layer encapsulates the metal contact structure, the etchant cannot contact the metal contact structure during removal of the metal hard mask. Therefore, the choice of etchant used to remove the metal hard mask is not limited by the composition of the metal contact structure. Further, integrated circuits having metal contact structures formed from the same metal as the metal hard mask do not exhibit voids at or near their top surfaces due to metal hard mask removal processes.

FIGS. 1-6 illustrate partially completed integrated circuits and methods for fabricating the partially completed integrated circuits in accordance with various embodiments. Various steps in the design and composition of integrated circuits are well known and so, in the interest of brevity, many conventional steps will only be mentioned briefly herein or will be omitted entirely without providing the known process details. Further, it is noted that integrated circuits include a varying number of components and that single components shown in the illustrations may be representative of multiple components.

Figure 1:
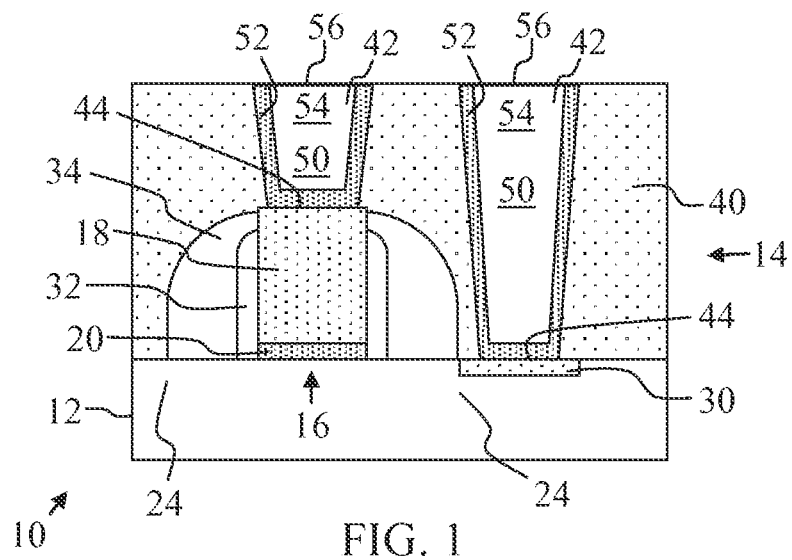
FIGS. 1-6 are cross-sectional views of a portion of an integrated circuit including a metal contact structure for connection to a metal interconnect, and method steps for fabricating an integrated circuit in accordance with various embodiments herein.

In FIG. 1, in an exemplary embodiment, a method for fabricating an integrated circuit 10 begins by providing a semiconductor substrate 12. The semiconductor substrate 12 is preferably a silicon substrate (the term "silicon substrate" encompassing the relatively pure silicon materials typically used in the semiconductor industry as well as silicon admixed with other elements, such as germanium and the like). Alternatively, semiconductor substrate 12 can be realized as germanium, gallium arsenide, and the like, or the semiconductor substrate 12 can include layers of different semiconductor materials.

In FIG. 1, a device 14 is formed on the semiconductor substrate 12. For purposes of illustration, the device 14 shown in FIG. 1 is a MOS transistor. The illustrated device 14 includes a gate structure 16 formed on the semiconductor substrate 12. The gate structure 16 includes a gate electrode 18 separated from the semiconductor substrate 12 by a gate insulation layer 20. The device 14 further includes active regions 24, such as drain/source regions, formed within the semiconductor substrate 12 around the gate structure 16. Extension regions may also be provided for advanced field effect transistors. Metal silicide regions 30 may be formed in the active regions 24 and on the gate electrode 18 (not shown). Spacers 32 and 34 may be formed at the sidewalls of the gate electrode 18 for tailoring the shape and spacing of the active regions 24 and/or the metal silicide regions 30 with respect to the gate electrode 18.

In FIG. 1, a dielectric material 40 is formed over the device 14. Contact openings 42 are etched into the dielectric material 40 to expose contact sites 44 to the device 14 at the gate electrode 18 and/or active regions 24 (including metal silicide regions 30, if utilized). Metal contact structures 50 are formed in the contact openings 42. Specifically, a barrier metal 52, such as titanium nitride, is deposited on the contact site 44 and along the sidewalls of each contact opening 42. Then, a plug metal 54, such as copper, is deposited on the barrier metal 52 to fill the contact openings 42 and form the metal contact structures 50 in the partially formed integrated circuit 10. As shown, each metal contact structure 50 includes a top surface 56. Typically, the barrier metal 52 and plug metal 54 are deposited with an overburden that is removed by chemical mechanical planarization (CMP) to provide the metal contact structures 50 with the top surface 56 as shown.

Figure 2:
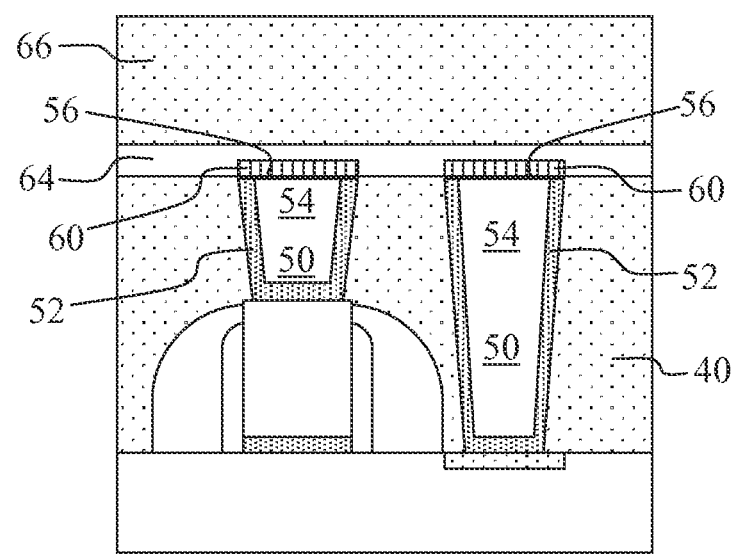

In FIG. 2, a capping layer 60 is selectively formed on the top surfaces 56 of the metal contact structures 50. An exemplary capping layer 60 may be an electrically conductive element or alloy, including, without limitation, cobalt tungsten phosphide (CoWP), cobalt tungsten boride (CoWB), cobalt, nickel, nickel phosphide (NiP), palladium, and platinum. The capping layer 60 may be formed by an electroless plating process. Such a process may include a preclean step for removing any residues from previous processing. Then an aqueous seeding solution is applied to the top surfaces 56 of the metal contact structures 50. The seeding solution forms a seed layer on the top surfaces 56 of the metal contact structures 50, i.e., on both the barrier metal 52 and the plug metal 54. The seed layer may be thermally decomposed during an optional thermal decomposition step. Then, a plating solution is applied to the seed layer. The electroless plating process selectively forms a capping layer 60 onto the metal contact structures 50. Notably, the capping layer 60 is not formed on the dielectric material 40. In an exemplary embodiment, the electroless plated capping layer 60 is formed with a thickness of about 2 nanometers (nm) to about 5 nm.

As shown in FIG. 2, a passivation layer 64 is formed over the dielectric material 40 and the capping layer 60. An exemplary passivation layer 64 is a nitrogen-doped silicon carbide layer such as NBLoK. Further, an interlayer dielectric 66 is formed over the passivation layer 64. The interlayer dielectric 66 may be a low-k material or an ultralow-k material. For example, the interlayer dielectric 66 may be organosilicate glass (SiCOH) and/or tetraethyl orthosilicate (TEOS) silicon oxide. Further, the interlayer dielectric 66 may include more than one layer of dielectric material.

Figure 3:
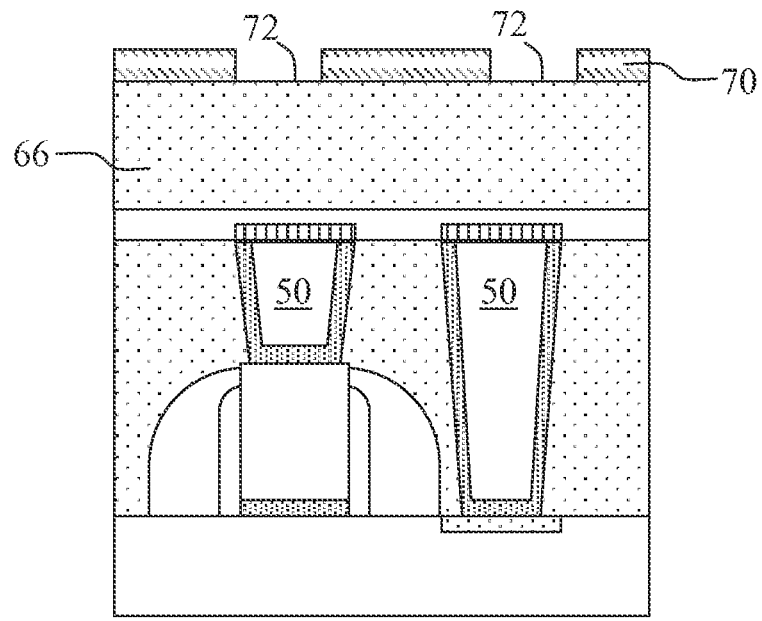

In FIG. 3, a metal hard mask 70 is deposited and patterned over the interlayer dielectric 66 according to conventional lithography process steps. An exemplary metal hard mask 70 is titanium nitride. As shown, the metal hard mask 70 is selectively patterned to provide exposed regions 72 of the interlayer dielectric 66 over the metal contact structures 50. Patterning of the metal hard mask 70 may be part of a dual damascene process for sequentially forming a trench or trenches and a via or vias in the interlayer dielectric 66. Dual damascene processes are well known, and for ease of illustration and to avoid obscuring the present subject matter, they are not described in greater detail herein. In an exemplary embodiment, the patterning of the metal hard mask 70 occurs in a trench first metal hard mask (TFMHM) process.

Figure 4:
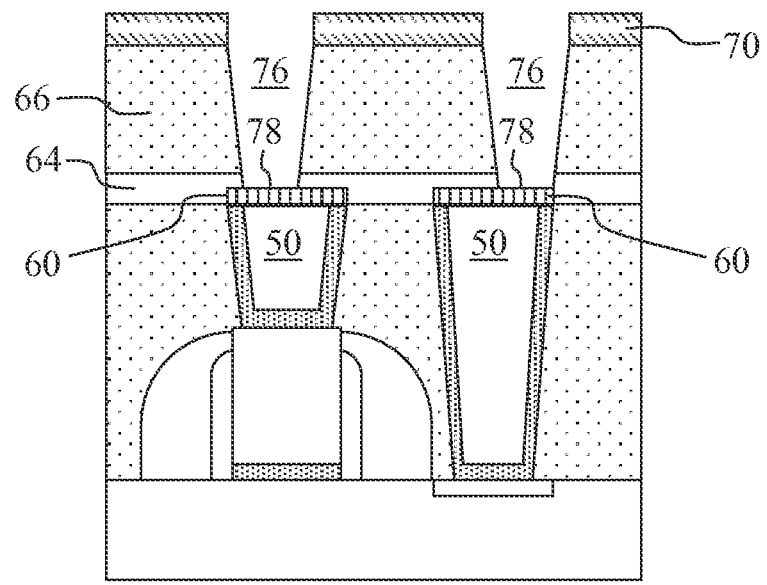

FIG. 4 shows the formation of via apertures 76 formed by etching the exposed regions 72 of the interlayer dielectric 66 using the metal hard mask 70 as a mask. An exemplary etching process is a reactive ion etch. The etch removes the interlayer dielectric 66 and the passivation layer 64 above the metal contact structures 50. Further, the etch exposes at least a portion 78 of the capping layer 60 above each metal contact structure 50.

Figure 5:
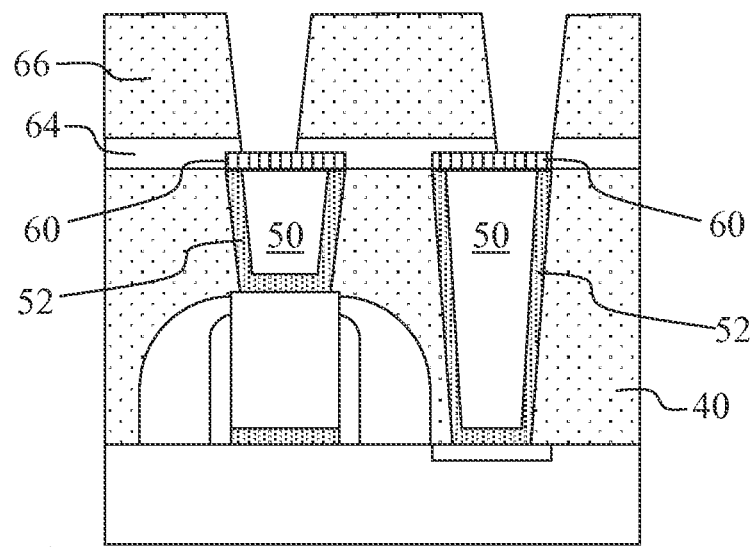

In FIG. 5, the metal hard mask 70 is removed from the integrated circuit 10. Specifically, the metal hard mask 70 is selectively wet etched using an appropriate etchant chemistry. For example, the etchant may be a hydrogen peroxide or ozone-containing blend. The etchant attacks and removes the metal hard mask 70 but the capping layer 60, passivation layer 64, and interlayer dielectric 66 are substantially impervious to the etchant for at least the duration of time it takes to remove the metal hard mask 70. For example, it has been found that the capping layer 60, passivation layer 64, and interlayer dielectric 66 resist attack by the etchant for at least two minutes. As a result, the metal contact structure 50, and particularly the barrier metal 52 when the barrier metal is the same metal as the metal hard mask 70, is protected from the etchant. Structurally, the metal contact structure 50 is encapsulated by the capping layer 60, the passivation layer 64 and the dielectric material 40. As a result, the metal contact structure 50 is physically separated from the etchant.

Figure 6:
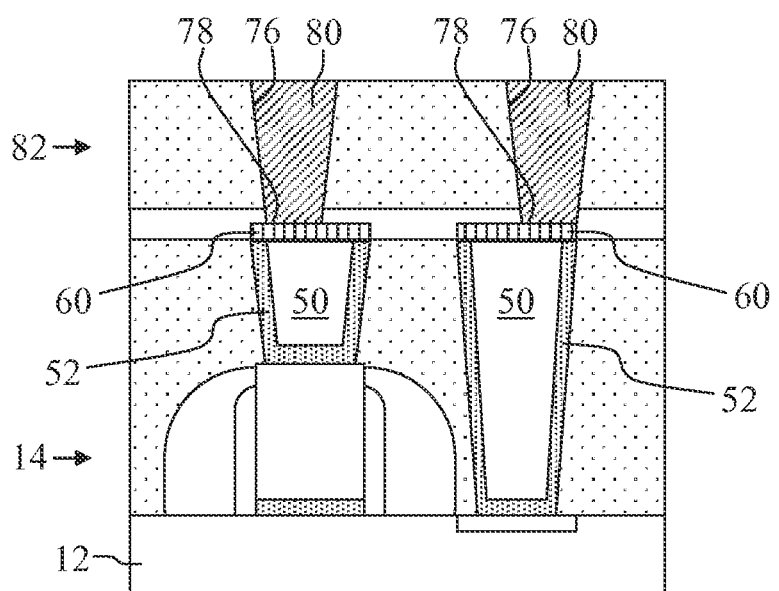

In FIG. 6, conductive vias 80 are formed by depositing a conductive material, such as copper, into the via apertures 76 to form a metal interconnect 82. As shown, the conductive vias 80 abut the previously exposed portions 78 of the capping layer 60. As the exemplary capping layer 60 is electrically conductive, the conductive vias 80 are in electrical communication with the metal contact structures 50. Further processing may include formation of additional metallization layers to complete the metal interconnect 82 and/or other back end of line (BEOL) process steps.

As shown, the integrated circuit 10 of FIG. 6 includes a metal contact structure 50 connected to a device 14 overlying a semiconductor substrate 12, an electrically conductive capping layer 60 formed on the metal contact structure 50, and a conductive via 80 electrically connected to the metal contact structure 50 through the electrically conductive capping layer 60. As described above, the integrated circuit 10 exhibits improved metal integrity in the metal contact structure 50, as attack by the metal hard mask etchant is inhibited. This is particularly beneficial when the metal contact structure 50 includes a barrier metal 52 that is of the same composition as the metal hard mask 70, such as when both are titanium nitride. Further, the use of the capping layer 60 provides for a broader range of etchants to select for removing the metal hard mask 70 as concerns related etching of or damage to the metal contact structure 50 are reduced or eliminated.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An integrated circuit comprising:
a metal contact structure;
an electrically conductive capping layer formed on the metal contact structure; and
a conductive via electrically connected to the metal contact structure through the electrically conductive capping layer and physically separated from the metal contact structure by the electrically conductive capping layer.

2. The integrated circuit of claim 1 wherein the metal contact structure has an upper surface, wherein the conductive via contacts the capping layer at an interface, and wherein the interface is parallel to the upper surface.

3. The integrated circuit of claim 1 wherein the metal contact structure includes a first barrier metal portion, a second barrier metal portion, and a plug metal located between the first barrier metal portion and the second barrier metal portion; wherein a top surface of the plug metal extends from the first barrier metal portion to the second barrier metal portion, and wherein the electrically conductive capping layer covers the top surface of the plug metal from the first barrier metal portion to the second barrier metal portion.

4. The integrated circuit of claim 1 further comprising a dielectric material formed around the metal contact structure and having an upper surface, wherein the metal contact structure includes a first barrier metal portion, a second barrier metal portion, and a plug metal located between the first barrier metal portion and the second barrier metal portion; wherein a top surface of the plug metal extends from the first barrier metal portion to the second barrier metal portion, and wherein the upper surface of the dielectric material and the top surface of the plug metal are co-planar.

5. The integrated circuit of claim 1 wherein a portion of the electrically conductive capping layer lies under the conductive via.

6. The integrated circuit of claim 1 wherein the metal contact structure includes a barrier metal and a plug metal, and wherein the plug metal is physically encapsulated by the barrier metal and the electrically conductive capping layer.

7. The integrated circuit of claim 2 further comprising a passivation layer on the capping layer and an interlayer dielectric material on the passivation layer, wherein the conductive via passes through the passivation layer and the interlayer dielectric material.

8. The integrated circuit of claim 3 further comprising a nitrogen-doped silicon carbide passivation layer on the capping layer and an interlayer dielectric material on the passivation layer, wherein the conductive via passes through the nitrogen-doped silicon carbide passivation layer and the interlayer dielectric material.

9. The integrated circuit of claim 4 further comprising a passivation layer on the capping layer and a low-k or ultralow-k interlayer dielectric material on the passivation layer, wherein the conductive via passes through the passivation layer and the low-k or ultralow-k interlayer dielectric material.

10. The integrated circuit of claim 5 further comprising a passivation layer on the capping layer and an organosilicate glass interlayer dielectric material on the passivation layer, wherein the conductive via passes through the passivation layer and the organosilicate glass interlayer dielectric material.

11. The integrated circuit of claim 6 further comprising a passivation layer on the capping layer and a tetraethyl orthosilicate (TEOS) silicon oxide interlayer dielectric material on the passivation layer, wherein the conductive via passes through the passivation layer and the tetraethyl orthosilicate (TEOS) silicon oxide interlayer dielectric material.

12. The integrated circuit of claim 1 further comprising a dielectric material formed around the metal contact structure, wherein the metal contact structure has a first side in contact with the dielectric material, a second side in contact with the dielectric material, and a planar upper surface extending from the first side to the second side.

13. The integrated circuit of claim 1 wherein the capping layer has a thickness, wherein the metal contact structure has an upper surface, and wherein the conductive via has a lower surface located at a distance from the upper surface equal to the thickness.

14. An integrated circuit comprising:
a semiconductor substrate;
a gate structure formed in and/or over the semiconductor substrate;

an active region formed in and/or over the semiconductor substrate and adjacent the gate structure;

a first metal contact structure electrically connected to the gate structure and a second metal contact structure electrically connected to the active region, wherein each metal contact structure comprises a barrier metal and a plug metal;

an electrically conductive capping layer formed on each metal contact structure; and a dielectric material overlying the semiconductor substrate and adjacent each metal contact structure, and wherein the barrier metal of each metal contact structure is encapsulated by the dielectric material, the electrically conductive capping layer, and the plug metal.

15. The integrated circuit of claim 14 wherein the dielectric material overlying the semiconductor substrate defines a first trench and a second trench in the dielectric material, and wherein the first metal contact structure is formed completely within the first trench and the second metal contact structure is formed completely within the second trench.

16. The integrated circuit of claim 15 further comprising a passivation layer extending over the dielectric material and in contact with each electrically conductive capping layer.

17. The integrated circuit of claim 14 wherein a first segment of the electrically conductive capping layer is located directly over the gate structure and a second segment of the electrical conductive capping layer is located directly over the active region.

18. The integrated circuit of claim 14 wherein the dielectric material overlying the semiconductor substrate has an upper surface and defines a first trench and a second trench in the dielectric material, wherein the first metal contact structure is formed within the first trench and the second metal contact structure is formed within the second trench, and wherein each metal contact structure has a planar upper surface coplanar with the upper surface of the dielectric material.

19. The integrated circuit of claim 14 wherein the dielectric material and the metal contact structure have co-planar upper surfaces, and wherein the electrically conductive capping layer is not formed on the upper surface of the dielectric material.

* * * * *